(12) United States Patent
Masnaghetti et al.

(10) Patent No.: US 10,366,862 B2
(45) Date of Patent: Jul. 30, 2019

(54) METHOD AND SYSTEM FOR NOISE MITIGATION IN A MULTI-BEAM SCANNING ELECTRON MICROSCOPY SYSTEM

(71) Applicant: KLA-Tencor Corporation, Milpitas, CA (US)

(72) Inventors: Doug K. Masnaghetti, San Jose, CA (US); Richard R. Simmons, Los Altos, CA (US); Mark A. McCord, Los Gatos, CA (US); Rainer Knippelmeyer, Groton, MA (US)

(73) Assignee: KLA-Tencor Corporaton, Milpitas, CA (US)

( * ) Notice: Subject to any disclaimer, the term of this patent is extended or adjusted under 35 U.S.C. 154(b) by 0 days.

(21) Appl. No.: 15/267,223

(22) Filed: Sep. 16, 2016

(65) Prior Publication Data
US 2017/0084423 A1  Mar. 23, 2017

Related U.S. Application Data

(60) Provisional application No. 62/221,599, filed on Sep. 21, 2015.

(51) Int. Cl.
*H01J 37/22* (2006.01)
*H01J 37/28* (2006.01)
*H01J 37/09* (2006.01)

(52) U.S. Cl.
CPC .......... *H01J 37/222* (2013.01); *H01J 37/09* (2013.01); *H01J 37/28* (2013.01); *H01J 2237/0216* (2013.01); *H01J 2237/2817* (2013.01)

(58) Field of Classification Search
CPC .. H01J 37/00; H01J 37/02; H01J 37/26; H01J 37/28; H01J 37/04; H01J 37/045; H01J 37/22; H01J 37/244; H01J 37/222
USPC ........................................ 250/306, 307, 311
See application file for complete search history.

(56) References Cited

U.S. PATENT DOCUMENTS

| 5,659,172 A | 8/1997 | Wagner et al. |
| 5,887,080 A | 3/1999 | Tsubusaki et al. |
| 5,981,948 A * | 11/1999 | Taniguchi ............... H01J 37/26 250/305 |

(Continued)

FOREIGN PATENT DOCUMENTS

EP  2388796 A1  11/2011

*Primary Examiner* — Jason L McCormack
(74) *Attorney, Agent, or Firm* — Suiter Swantz pc llo

(57) ABSTRACT

A scanning electron microscopy system is disclosed. The system includes a multi-beam scanning electron microscopy (SEM) sub-system. The SEM sub-system includes a multi-beam electron beam source configured to generate a plurality of electron beams, a sample stage configured to secure a sample, an electron-optical assembly, and a detector assembly configured to detect a plurality of electron signal beams emanating from the surface of the sample to form a plurality of images, each image associated with an electron beam of the plurality of electron beams. The system includes a controller configured to receive the images from the detector assembly, compare two or more of the images to identify common noise components present in the two or more images, and remove the identified common noise components from one or more images of the plurality of images.

9 Claims, 5 Drawing Sheets

(56) References Cited

U.S. PATENT DOCUMENTS

| | | | |
|---|---|---|---|
| 2003/0066963 A1* | 4/2003 | Parker | G21K 1/087 |
| | | | 250/310 |
| 2005/0214958 A1* | 9/2005 | Nakasuji | G01N 23/225 |
| | | | 438/14 |
| 2009/0256075 A1* | 10/2009 | Kemen | H01J 37/045 |
| | | | 250/307 |
| 2014/0054458 A1 | 2/2014 | Own et al. | |
| 2015/0034822 A1 | 2/2015 | Reinhorn et al. | |
| 2015/0130948 A1* | 5/2015 | Cogliati | G01T 1/244 |
| | | | 348/162 |
| 2015/0348749 A1* | 12/2015 | Lang | H01J 37/222 |
| | | | 250/307 |

\* cited by examiner

METHOD AND SYSTEM FOR NOISE MITIGATION IN A MULTI-BEAM SCANNING ELECTRON MICROSCOPY SYSTEM

CROSS-REFERENCE TO RELATED APPLICATION

The present application claims benefit under 35 U.S.C. § 119(e) and constitutes a regular (non-provisional) patent application of U.S. Provisional Application Ser. No. 62/221,599, filed Sep. 21, 2015, entitled TECHNIQUE FOR NOISE REJECTION IN A MULTIPLE-BEAM IMAGING SYSTEM, naming Mark McCord, Rainer Knippelmeyer, Douglas Masnaghetti and Richard Simmons as inventors, which is incorporated herein by reference in the entirety.

TECHNICAL FIELD

The present invention generally relates to scanning electron microscopy, and, in particular, to noise mitigation in a multi-beam electron microscopy system.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size becomes smaller and smaller, it becomes critical to develop enhanced inspection and review devices and procedures. One such inspection technology includes electron beam based inspection systems, such as, scanning electron microscopy (SEM). Single beam SEM systems may image a surface of a sample through the collection and analysis of electrons emitted or scattered from the surface of the sample as a primary beam is scanned across the sample. In single beam SEM systems, it is generally difficult to separate noise from image information. This difficulty arises due to the fact that i) it is difficult to be certain that an image artifact is noise and not an actual image feature; and ii) there may not be enough feature information (such as straight sharp edges) in a single image to extract noise. With the implementation of multi-beam SEM systems, inspection times have reduced dramatically due to the simultaneous acquisition of image data from multiple regions of a sample, however noise mitigation techniques in multi-beam SEM systems have proven ineffective. Therefore, it would be advantageous to provide a system and method that reduces or mitigates noise in a multi-beam SEM system.

SUMMARY

A multi-beam scanning electron microscopy apparatus is disclosed, in accordance with one or more illustrative embodiments of the present disclosure. In one embodiment, the multi-beam scanning electron microscopy sub-system includes a multi-beam electron beam source configured to generate a plurality of electron beams. In another embodiment, the multi-beam scanning electron microscopy sub-system includes a sample stage configured to secure a sample. In another embodiment, the multi-beam scanning electron microscopy sub-system includes an electron-optical assembly including a set of electron-optical elements configured to direct at least a portion of the plurality of electron beams onto a portion of the sample. In another embodiment, the multi-beam scanning electron microscopy sub-system includes a detector assembly configured to detect a plurality of electron signal beams emanating from the surface of the sample to form a plurality of images, each image associated with an electron beam of the plurality of electron beams. In another embodiment, the multi-beam scanning electron microscopy sub-system includes a controller including one or more processors configured to execute a set of program instructions stored in memory for causing the one or more processors to: receive the plurality of images from the detector assembly; compare two or more of the images to identify common noise components present in the two or more images; and remove the identified common noise components from one or more images of the plurality of images.

A multi-beam scanning electron microscopy apparatus is disclosed, in accordance with one or more illustrative embodiments of the present disclosure. In one embodiment, the multi-beam scanning electron microscopy apparatus includes a multi-beam scanning electron microscopy sub-system. In another embodiment, the multi-beam scanning electron microscopy sub-system includes a multi-beam electron beam source configured to generate a plurality of electron beams. In another embodiment, a multi-beam scanning electron microscopy sub-system includes a sample stage configured to secure a sample. In another embodiment, the multi-beam scanning electron microscopy sub-system includes an electron-optical assembly including a set of electron-optical elements configured to direct at least a portion of the plurality of electron beams onto a portion of the sample. In another embodiment, the multi-beam scanning electron microscopy sub-system includes a detector assembly configured to detect a plurality of electron signal beams from the surface of the sample to form a plurality of images, each image associated with an electron beam of the plurality of electron beams. In another embodiment, the multi-beam scanning electron microscopy apparatus includes a controller including one or more processors configured to execute a set of program instructions stored in memory for causing the one or more processors to: receive the plurality of images from the detector assembly; compare two or more of the images to identify common noise components present in the two or more images; and report the identified common noise components.

A multi-beam scanning electron microscopy apparatus is disclosed, in accordance with one or more illustrative embodiments of the present disclosure. In one embodiment, the multi-beam scanning electron microscopy apparatus includes a multi-beam scanning electron microscopy sub-system. In another embodiment, the multi-beam scanning electron microscopy sub-system includes a multi-beam electron beam source configured to generate a plurality of electron beams. In another embodiment, the multi-beam scanning electron microscopy sub-system includes a sample stage configured to secure a sample. In another embodiment, the multi-beam scanning electron microscopy sub-system includes an electron-optical assembly including a set of electron-optical elements configured to direct at least a portion of the plurality of electron beams onto a portion of the sample. In another embodiment, the multi-beam scanning electron microscopy sub-system includes a detector assembly configured to simultaneously detect a plurality of electron signal beams emanating from the surface of the sample to form a plurality of simultaneously-acquired images, wherein the detector assembly is configured to acquire a set of repeat images for each electron signal beam.

In another embodiment, the multi-beam scanning electron microscopy apparatus includes a controller including one or more processor configured to execute a set of program instructions stored in memory for causing the one or more processors to: receive the plurality of simultaneously-acquired images from the detector assembly; determine an alignment procedure based on a comparison of two or more of the simultaneously-acquired plurality of images; perform the alignment procedure on two or more repeat images corresponding with one or more of the electron signal beams; and combine the plurality of repeat images to form an aggregated image for each electron signal beam.

A method is disclosed, in accordance with one or more illustrative embodiments of the present disclosure. In one embodiment, the method includes simultaneously acquiring a plurality of images with a multi-beam scanning electron microscopy system. In another embodiment, the method includes comparing two or more of the images to identify common noise components present in the two or more images. In another embodiment, the method includes removing the identified common noise components from one or more images of the plurality of images.

A method is disclosed, in accordance with one or more illustrative embodiments of the present disclosure. In one embodiment, the method includes simultaneously acquiring a plurality of images with a multi-beam scanning electron microscopy system. In another embodiment, the method includes comparing two or more of the images to identify common noise components present in the two or more images. In another embodiment, the method includes reporting the identified common noise components.

A method is disclosed, in accordance with one or more illustrative embodiments of the present disclosure. In one embodiment, the method includes simultaneously acquiring a plurality of images with a plurality of electron signal beams of a multi-beam scanning electron microscopy system. In another embodiment, the method includes determining an alignment procedure based on a comparison of two or more of the simultaneously-acquired plurality of images. In another embodiment, the method includes performing the alignment procedure on two or more repeat images corresponding with one or more of the electron signal beams. In another embodiment, the method includes combining the plurality of repeat images to form an aggregated image for each electron signal beam.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. Referring generally to FIGS. 1 through 3C, a system and method for mitigating noise in a multi-beam scanning electron microscopy (SEM) imaging system is described in accordance with the present disclosure.

Embodiments of the present disclosure are directed to reducing or eliminating common mode noise in a multi-beam SEM system. It is noted that such noise can come from a variety of sources, including, but not limited to, vibrational noise, acoustic noise, electrical noise (e.g., 60 Hz noise), errors/malfunctions in high voltage power supplies, and intensity noise originating in the electron source or gun. The noises components can be positional (e.g., in x-position, y-position and/or z-position (focus)) or intensity (i.e., brightness). Additional embodiments of the present disclosure are directed to correcting for the presence of noise components (e.g., via image processing) in the multiple images, such as in cases where the noise is positional noise. Additional embodiments of the present disclosure are directed to rescanning one or more images in response to the identification of one or more noise components, such as in cases where the noise is related to defocus or high voltage malfunctions. Additional embodiments of the present disclosure are directed to the identification of false defects in the image. In this case, the identified false defects may be ignored.

Figure 1:
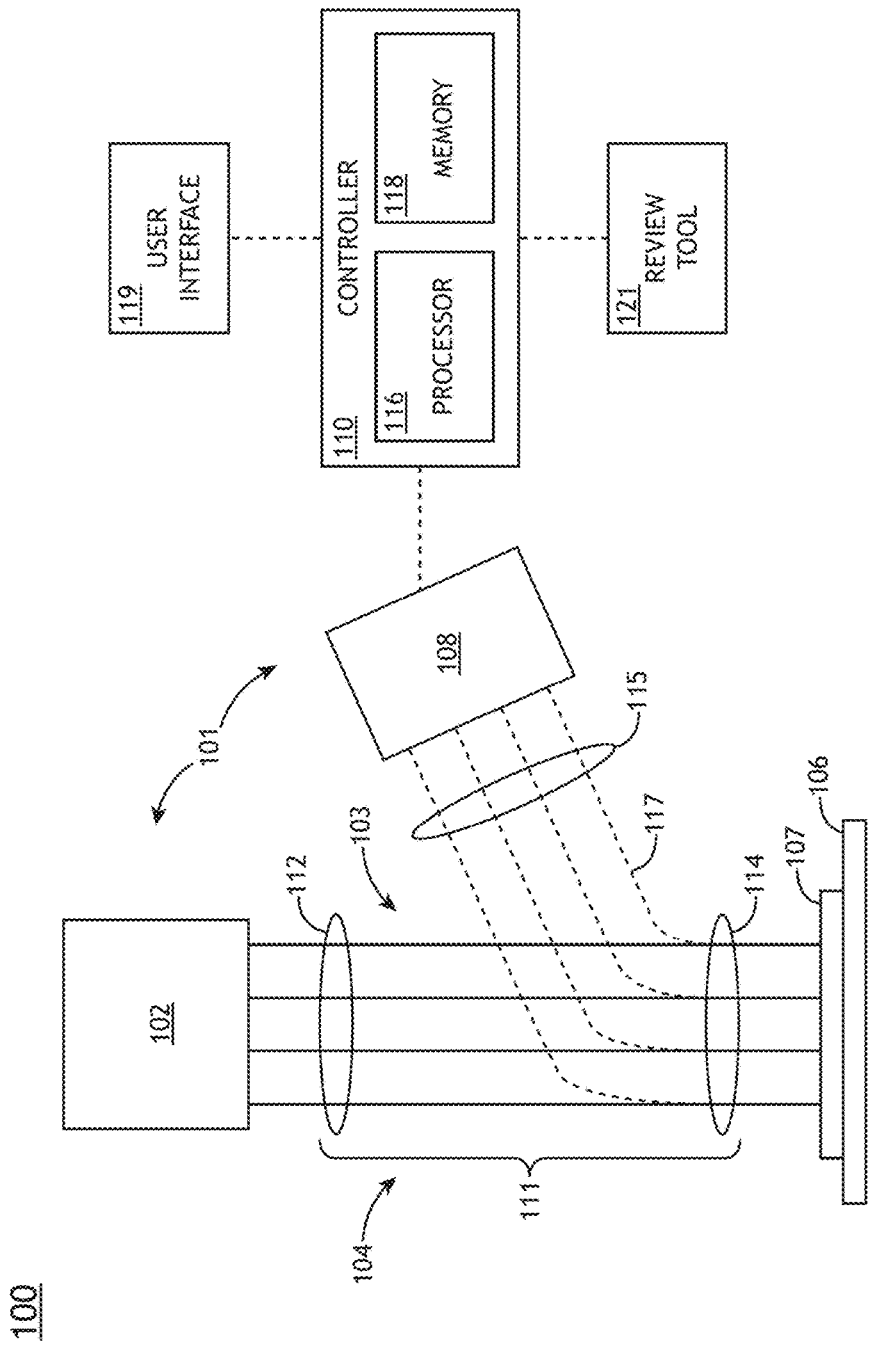
FIG. 1 is a block diagram view of a multi-beam scanning electron microscopy system with noise removal capabilities, in accordance with one embodiment of the present disclosure.

FIG. 1 illustrates a system 100 for performing multi-beam SEM imaging, in accordance with one or more embodiments of the present disclosure.

In one embodiment, the system 100 includes a multi-beam scanning electron microscopy (SEM) sub-system 101 and a controller 110. The multi-beam SEM sub-system 101 may include any multi-beam SEM sub-system or multi-beam SEM tool known in the art. For example, the multi-beam SEM sub-system 101 may include, but is not limited to, a multi-beam electron beam source 102, an electron-optical assembly 104, a sample stage 106, and a detector assembly 108.

In one embodiment, the controller 110 is communicatively coupled to the multi-beam SEM sub-system 101. For example, the controller 110 may be coupled to the output of the detector assembly 108 of the SEM sub-system 101. The controller 110 may be coupled to the output of the detector assembly 108 in any suitable manner (e.g., by one or more transmission media indicated by the line shown in FIG. 1) such that the controller 110 can receive the output acquired by the detector assembly 108.

In one embodiment, the controller 110 includes one or more processors 116 and a memory medium 118 (or memory). The one or more processors 116 are configured to execute a set of program instructions maintained in the memory medium 118 for causing the one or more processors to carry out one or more of the various steps described through the present disclosure.

In one embodiment, the program instructions are configured to cause the one or more processors to remove one or more common mode noise components that occur simultaneously in SEM images acquired by the multi-beam SEM sub-system 101. In one embodiment, the program instructions are configured to cause the one or more processors 116 to receive multiple SEM images from the detector assembly 108. In another embodiment, the program instructions are configured to cause the one or more processors 116 to compare two or more of the SEM images to one another in order to identify common noise components (e.g., position noise or intensity noise) present in the two or more images. In another embodiment, the program instructions are configured to cause the one or more processors 116 to remove the identified common noise components from the two or more images (and/or additional images of the multiple SEM image set).

It is noted herein that, in the case of multi-beam SEM measurements, many noise sources and glitches are common mode, thereby affecting all beams equally and simultaneously. Examples of common mode noise include, but are not limited to, vibrational noise, electromagnetic interference, high voltages associated with one or more components and variations in cathode emission current (in cases where all beams are driven from a common cathode). For instance, high voltage connections associated with an objective lens or the substrate biasing of system 100 are often the most common sources of electrical arcing, whereby the substrate (e.g., wafer) outgases and produces electrical arcs. The controller 110 may analyze the images acquired by the SEM sub-system 101 for such noise. In a single image, it may not be possible to separate noise from other image attributes such as line edge roughness. However, if the same noise is identified in multiple images (i.e., the images contain common noise components), then there is reasonable confidence that the artifact is indeed noise, and it can be removed. For example, in the case where the SEM sub-system 101 includes N simultaneously operating beams (e.g., 2 to 100 beams), where N corresponding images are simultaneously acquired by the detector assembly 108, the N images can be analyzed for noise. In the case where an artifact is observed in multiple of the N images then the repeating artifact may be considered true noise.

Figure 2:
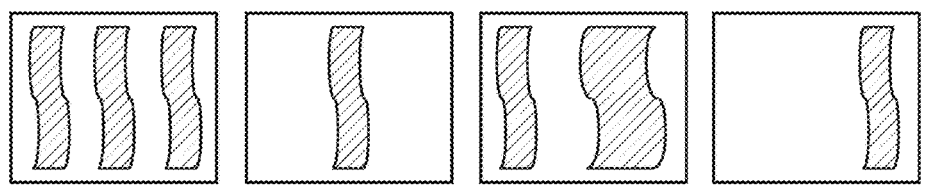
FIG. 2 is conceptual view of the identification and removal of noise components in multi-beam scanning electron microscopy imagery data, in accordance with one embodiment of the present disclosure.
Figure 2:
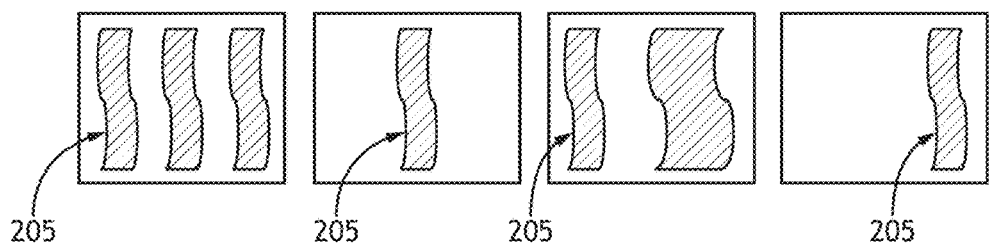
Figure 2:
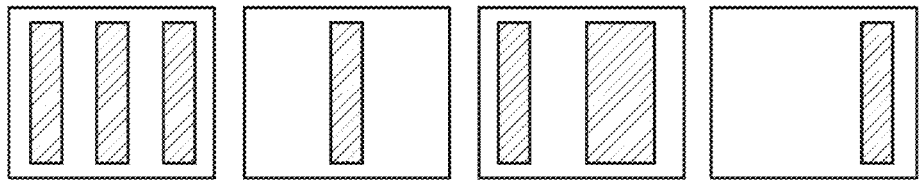

In one embodiment, the noise components that are removed from one or more images are positional noise. For example, the noise components may include noise in the x- and y-position information. In the case of x- and y-position noise, one or more images (e.g., all of the N images or a sub-set of the N-images) may be shifted by an amount equal in distance and opposite in direction to the identified noise. For example, FIG. 2 illustrates a conceptual view of the removal of x- and y-position noise from multiple SEM images. In a first step 202, four SEM images are acquired with the multi-beam SEM sub-system 101. In a second step 204, the common noise components 205 are identified across the four SEM images (left to right) with controller 110. In this regard, the controller 110 may compare two or more of the images using any known image comparison algorithm known in the art in order to identify common features or patterns across the different images. In doing so, common spatial features 205 are identified in two or more of the SEM images. In a third step 206, the common noise components 205 identified in step 204 are removed. For example, in the case of positional noise, all effected images can be shifted by an amount equal in distance and opposite in direction to the identified noise component. As a result, the controller 110 may generate the noise-redacted images shown in step 206. It is noted that the corrections made to images may be carried out using any known image processing technique known in the art.

In another embodiment, the noise components that are removed from one or more images are intensity noise. In the case of common intensity variations, a brightness correction can be made to the pixel gray level values of two or more of the N images. It is noted herein that positional noise and/or intensity noise is generally a function of location within a given image.

It is further noted that both a positional and intensity correction may be applied to one or more of the N images so as to simultaneously correct for positional and intensity noise.

It is further noted that in some instances an amplifier associated with the detector assembly 108 may saturate such that intensity correction cannot be adequately performed. In this case, the associated pixel or pixels may be ignored and flagged in the inspection data as being "ignored."

In another embodiment, the program instructions are configured to cause the one or more processors to identify and report common noise components that occur simultaneously in SEM images. In one embodiment, after common noise components are identified across multiple of the N images, the program instructions of controller 110 may cause the one or more processors 116 to report the identified common noise components.

In one embodiment, the controller 110 may report the identified common noise components to a user interface 119. In this regard, the identified common noise component may be transmitted to the user interface 119, where the noise component is displayed on the display of the user interface 119 for analysis by a user (not shown).

In one embodiment, the controller 110 may report the identified common noise components to an additional tool. For example, the controller 110 may report the identified common noise components (or instructions to mitigate the presence of the noise components) to a review tool 121 or the SEM sub-system 101 itself.

In one embodiment, the controller 110 is configured to identify one or more false defects within the one or more images of the N images. In this embodiment, the controller 110 may compare two or more of the images from the detector assembly 108 to identify one or more false defects within one or more images of the plurality of images. In the case where the system 100 is configured as an electron beam inspector (EBI) and the image noise results in "defects" being found in the same place in multiple images, then these alleged defects can be identified as "false defects" and then be rejected. In this regard, the controller 110 may direct the review tool 121 to ignore the false defects during review of real defects identified by the multi-beam SEM sub-system 101.

In another embodiment, the controller 110 is configured to identify one or more focus errors within the one or more images of the N images. It is noted herein that in the case of some types of noise, such as focus variations, it is difficult to remove the noise. In the case of focus variation, it is not generally possible to reconstruct and in-focus image from an out-of-focus image. As such, in order to mitigate the impact of common focus variation in multiple images, the controller 110 may direct the multi-beam SEM sub-system 101 to rescan a sample 107 to acquire new images.

In another embodiment, the program instructions are configured to cause the one or more processors 116 to average multiple repeat SEM images via an image alignment procedure.

In one embodiment, the SEM sub-system 101 may acquire two or more "repeat" images for each channel defined by the primary beam 103 and signal beam 117. Further, the controller 110 may combine (e.g., average) the multiple repeat images for each channel of the SEM sub-system 101 to form an aggregated image for each of the multiple channels of the SEM sub-system 101. For example, rather than take one slow image that takes 1 second to acquire, 10 fast images, each 1/10th of a second in duration, are acquired and averaged to create a single high-quality image.

In another embodiment, the controller 110 may extract a noise value from two or more of the simultaneously-acquired N images (e.g., all N images or a sub-set of the N images), which are acquired simultaneously across the multiple channels of the SEM sub-system 101. The average noise value (e.g., position or intensity of each pixel) can be used as a "ground truth." It is further noted that images that do not contain sufficient content to allow noise extraction, then they can be ignored. It is noted that since multi-beam SEMs typically have 10-100 beams a given SEM sub-system should acquire sufficient images to allow for noise extraction.

In one embodiment, utilizing the noise components identified in the simultaneously-acquired image, the repeat images may be corrected or aligned prior to combination. For example, low frequency noise in each repeat image can be removed by an alignment step performed on one or more of the repeat images before averaging them together.

It is further noted that in many semiconductor imaging applications, nominally identical structures are repeated many times across a die. In cases where identical structures are present in multiple fields, and the noise is common-mode, algorithms can more effectively determine the ground-truth shape of the identical structures and thus more accurately identify and remove the noise from the images.

Referring again to FIG. 1, it is noted herein that the multi-beam electron beam source 102 of the multi-beam SEM sub-system 101 may include any multi-beam electron source known in the art. For example, the multi-beam electron beam source 102 may include, but is not limited to, an electron gun (e.g., field emission gun or cathode) and an aperture plate. In this regard, the aperture plate may include multiple apertures arranged in an array so as to split the initial electron beam from the electron beam gun into multiple electron beams 103 (or "beamlets"). By way of another example, the electron beam source 102 may include multiple electron guns for generating multiple electron beams 103.

The sample stage 106 of the multi-beam SEM sub-system 101 may include any sample stage known in the art suitable for securing the sample 107. The sample 107 may include any sample suitable for inspection/review with electron-beam microscopy, such as, but not limited to, a substrate. The substrate may include, but is not limited to, a silicon wafer. In another embodiment, the sample stage 106 is an actuatable stage. For example, the sample stage 106 may include, but is not limited to, one or more translational stages suitable for selectably translating the sample 107 along one or more linear directions (e.g., x-direction, y-direction and/or z-direction). By way of another example, the sample stage 106 may include, but is not limited to, one or more rotational stages suitable for selectively rotating the sample 107 along a rotational direction. By way of another example, the sample stage 106 may include, but is not limited to, a rotational stage and a translational stage suitable for selectably translating the sample along a linear direction and/or rotating the sample 107 along a rotational direction. It is noted herein that the system 100 may operate in any scanning mode known in the art.

The detector assembly 108 of the multi-beam SEM sub-system 101 may include any detector assembly known in the art suitable for detecting multiple electron signals from the surface of the sample 107. In one embodiment, the detector assembly 108 includes an electron detector array. In this regard, the detector assembly 108 may include an array of electron-detecting portions. Further, each electron-detecting portion of the detector array of the detector assembly 108 may be positioned so as to detect an electron signal from sample 107 associated with one of the incident electron beams 103. In this regard, each channel of the detector assembly 108 corresponds to a particular electron beam of the multiple electron beams 103.

It is noted that the detector assembly 108 may be, but is not limited to, a secondary electron detector or a backscattered electron detector. The detector assembly 108 may include any type of electron detector known in the art. For example, the detector assembly 108 may include a micro-channel plate (MCP), a PIN or p-n junction detector array, such as, but not limited to, a diode array or avalanche photo diodes (APDs). By way of another example, the detector assembly 108 may include a high speed scintillator/photo-multiplier tube (PMT) detector.

The electron-optical assembly 104 may include any electron-optical assembly known in the art suitable for illuminating a sample with multiple electron beams and acquiring multiple images associated with the multiple electron beams. In one embodiment, the electron optical assembly 104 includes a set of electron optical-optical elements for directing the multiple electron beams 103 onto the surface of the sample 107. The set of electron-optical elements may form an electron-optical column 111. The set of electron-optical elements of the column 111 may direct at least a portion of the electron beams 103 onto multiple portions of the sample 107. The set of electron-optical elements may include any electron-optical elements known in the art suitable for focusing and/or directing the primary electron beams 103 onto the various areas of the sample 107. In one embodiment, the set of electron-optical elements includes one or more electron-optical lenses. For example, the one or more electron-optical lenses may include, but are not limited to, one or more condenser lenses 112 (e.g., magnetic condenser lens) for collecting electrons from the multi-beam source 102. By way of another example, the electron-optical lenses may include, but are not limited to, one or more objective lenses 114 (e.g., magnetic objective lens) for focusing the primary electron beams 103 onto the various areas of the sample 107.

In another embodiment, the electron optical assembly 104 includes a set of electron-optical elements for collecting electrons (e.g., secondary electrons and/or backscattered electrons) emanating from the sample 107 in response to the multiple primary electron beams 103 and directing and/or focusing those electrons to the detector assembly 108. For example, the electron optical assembly 104 may include, but is not limited to, one or more projection lenses 115 for focusing the multiple electron signal beams 117 to form multiple images of the various portions of the sample 107 at the detector assembly 108.

It is noted that the electron optical assembly 104 of system 100 is not limited to the electron-optical elements depicted in FIG. 1, which are provided merely for illustrative purposes. It is further noted that the system 100 may include any number and type of electron-optical elements necessary to direct/focus the multiple beams 103 onto the sample 107 and, in response, collect and image the corresponding signal beams 117 onto the detector assembly 108.

For example, the electron-optical assembly 104 may include one or more electron beam scanning elements (not shown). For instance, the one or more electron beam scanning elements may include, but are not limited to, one or more electromagnetic scanning coils or electrostatic deflectors suitable for controlling a position of the beams 103 relative to the surface of the sample 107. Further, the one or more scanning elements may be utilized to scan the electron beams 103 across the sample 107 in a selected pattern.

By way of another example, the electron-optical assembly 104 may include a beam separator (not shown) to separate the multiple electron signals emanating from the surface of the sample 107 from the multiple primary electron beams 103.

The one or more processors 116 of controller 110 may include any processing element known in the art. In this sense, the one or more processors 116 may include any microprocessor-type device configured to execute software algorithms and/or instructions. In one embodiment, the one or more processors 116 may consist of a desktop computer, mainframe computer system, workstation, image computer, parallel processor, or any other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from the non-transitory memory medium 118.

The memory medium 118 may include any storage medium known in the art suitable for storing program instructions executable by the associated one or more processors 116. For example, the memory medium 118 may include a non-transitory memory medium. The memory medium 118 may include, but is not limited to, a read-only memory, a random access memory, a magnetic or optical memory device (e.g., disk), a magnetic tape, a solid state drive and the like. It is noted herein that the memory medium 118 may be configured to store one or more results from the detector assembly 108 and/or the output of one or more of the various steps described herein. It is further noted that memory medium 118 may be housed in a common controller housing with the one or more processors 116. In an alternative embodiment, the memory medium 118 may be located remotely with respect to the physical location of the one or more processors 116. For instance, the one or more processors 116 may access a remote memory (e.g., server), accessible through a network (e.g., internet, intranet and the like).

The embodiments of the system 100 illustrated in FIG. 1 may be further configured as described herein. In addition, the system 100 may be configured to perform any other step(s) of any of the method embodiment(s) described herein.

Figure 3A:
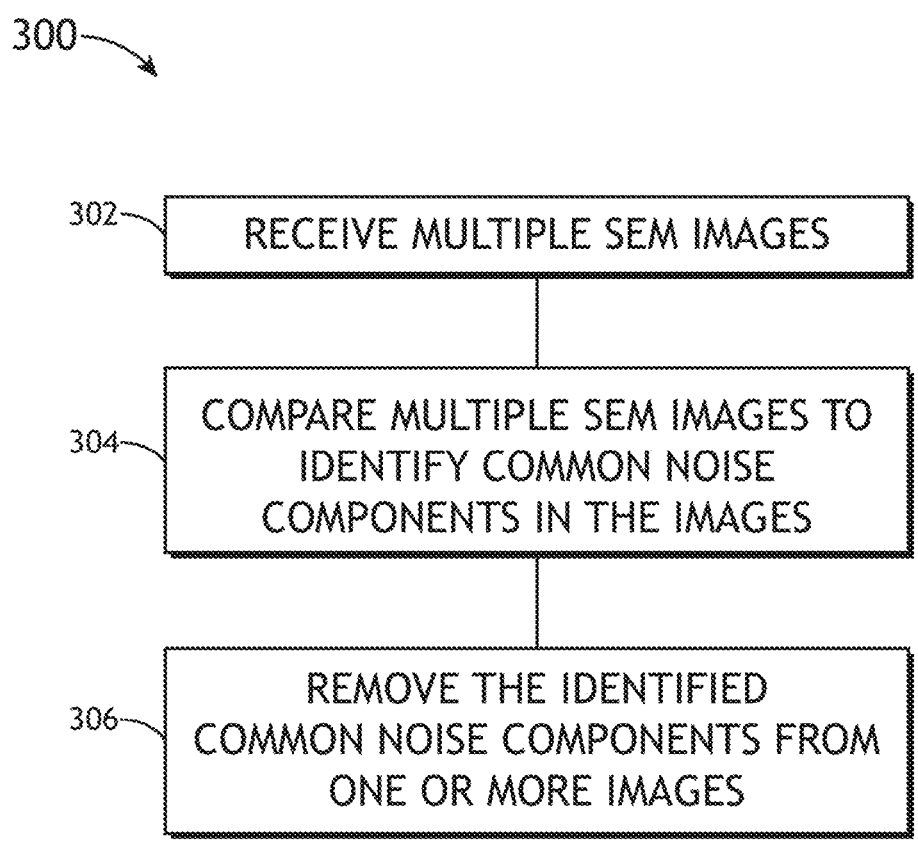
FIG. 3A is a process flow diagram illustrating a method for removing noise components from images acquired with a multi-beam scanning electron microscopy system, in accordance with one or more embodiments of the present disclosure.

FIG. 3A is a flow diagram illustrating steps performed in a method 300 of removing common mode noise components from multiple SEM images, in accordance with one or more embodiments of the present disclosure. It is noted herein that the steps of method 300 may be implemented all or in part by the system 100. It is further recognized, however, that the method 300 is not limited to the system 100 in that additional or alternative system-level embodiments may carry out all or part of the steps of method 300.

In step 302, multiple SEM images are received. In one embodiment, as shown in FIG. 1, multiple SEM images are acquired with the multi-image SEM sub-system 101. In turn, the detector assembly 108 may transmit the results of the multi-image data acquisition to the one or more processors 116 of the controller 110. In another embodiment, the images received by the controller 110 may be stored in memory 118 for later analysis and processing. In step 304, multiple SEM images are compared to identify common noise components in the images. In one embodiment, as shown in FIG. 1, the controller 110 may compare two or more of the simultaneously-acquired images to identify one or more common noise features (e.g., noise component 205 in FIG. 2). In step 306, the identified common noise components are removed from one or more of the simultaneously-acquired images.

Figure 3B:
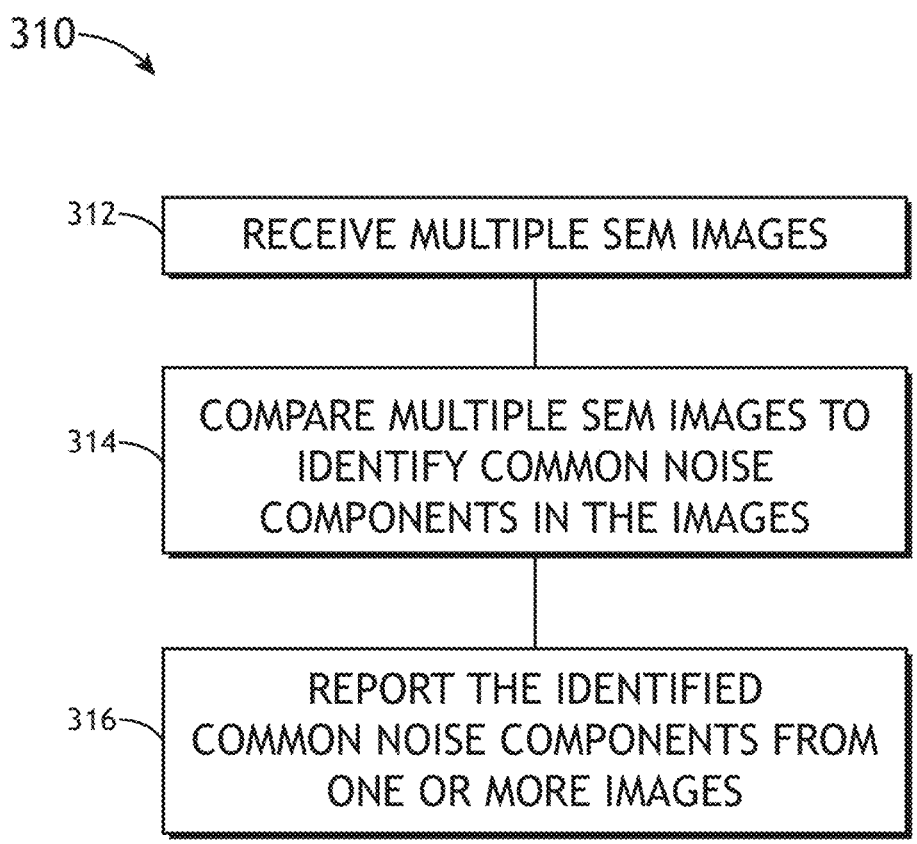
FIG. 3B is a process flow diagram illustrating a method for reporting noise components from images acquired with a multi-beam scanning electron microscopy system, in accordance with one or more embodiments of the present disclosure.

FIG. 3B is a flow diagram illustrating steps performed in a method 310 of reporting common mode noise components from multiple SEM images, in accordance with one or more embodiments of the present disclosure. It is noted herein that the steps of method 310 may be implemented all or in part by the system 100. It is further recognized, however, that the method 310 is not limited to the system 100 in that additional or alternative system-level embodiments may carry out all or part of the steps of method 310.

In step 312, multiple SEM images are received. In step 314, multiple SEM images are compared to identify common noise components in the images. In step 306, the identified common noise components are reported. For example, the identified common noise components, or instructions for mitigating/correcting for the common noise components may be reported to a tool. For instance, the identified common noise components, or instructions for mitigating/correcting for the common noise components may be reported to a review tool 121 communicatively coupled to the controller 110 so the review tool 121 may adjust to the presence of the noise components (e.g., ignore in the case of identified false defects). In another instance, the identified common noise components, or instructions for mitigating/correcting for the common noise components may be reported to the multi-beam SEM sub-system 101 so the SEM sub-system 101 may rescan images (e.g., rescan in the case of identified focus error).

Figure 3C:
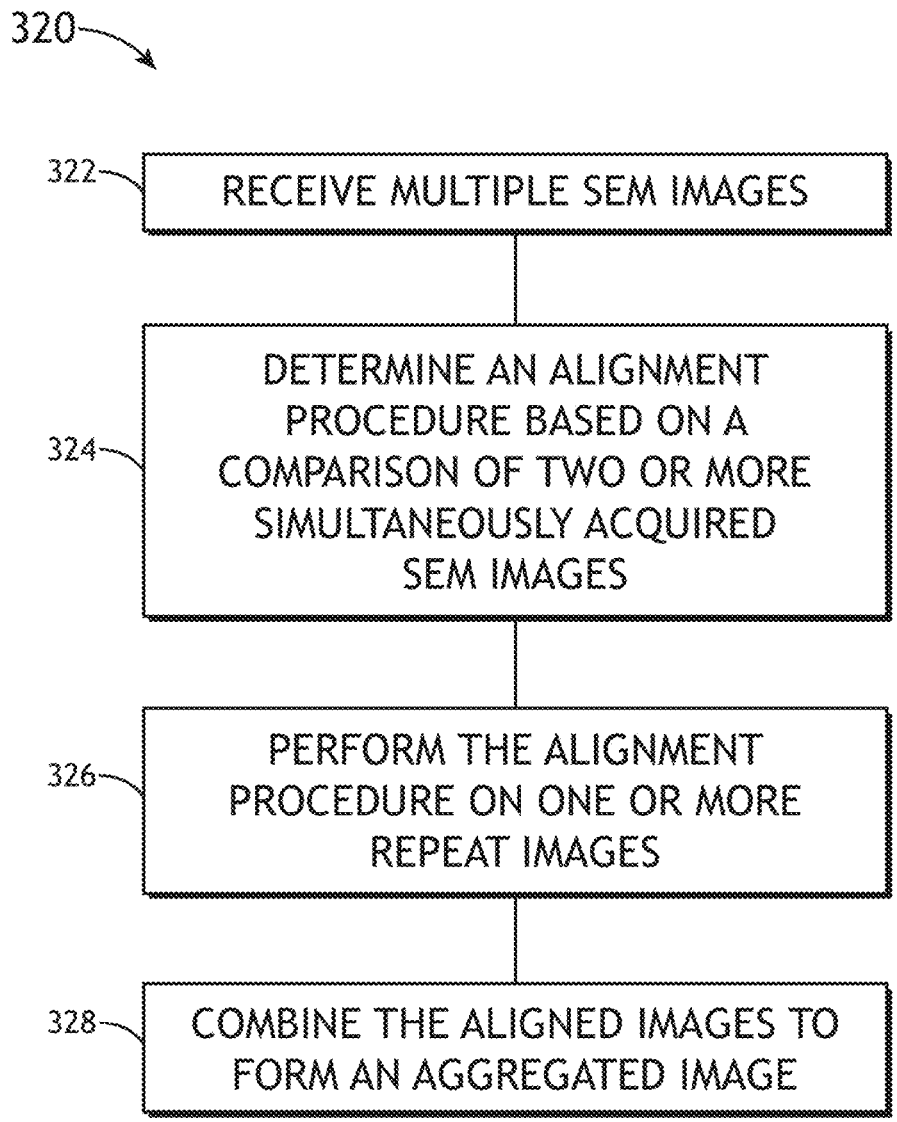
FIG. 3C is a process flow diagram illustrating a method for averaging multiple repeat images to form an aggregated image for each channel of the multi-beam scanning electron system, in accordance with one or more embodiments of the present disclosure.

FIG. 3C is a flow diagram illustrating steps performed in a method 320 of reporting common mode noise components from multiple SEM images, in accordance with one or more embodiments of the present disclosure. It is noted herein that the steps of method 320 may be implemented all or in part by the system 100. It is further recognized, however, that the method 320 is not limited to the system 100 in that additional or alternative system-level embodiments may carry out all or part of the steps of method 320.

In step 322, multiple SEM images are received. In step 324, an alignment procedure is determined based on a comparison of two or more simultaneously-acquired SEM images. For example, the controller 110 may extract a noise value from two or more of the simultaneously-acquired images, which are acquired simultaneously across the multiple channels of the SEM sub-system 101. In step 326, the alignment procedure is performed on one or more repeat images. For example, the noise components identified via the analysis of the simultaneously-acquired images, may be used to correct or align the repeat images prior to combination. In step 328, the aligned images are combined to form an aggregated image. For example, the aligned repeat images are averaged to form an averaged image. It is noted that this can be repeated for each channel of the SEM sub-system 101 such the simultaneous acquisition of images along each channel of the SEM sub-system 101 is repeated a selected number of times. The repeated images along each channel are aligned and then averaged to form a single set of images across the channels of the multi-beam SEM sub-system 101.

All of the methods described herein may include storing results of one or more steps of the method embodiments in the memory medium 118. The results may include any of the results described herein and may be stored in any manner known in the art. After the results have been stored, the results can be accessed in the memory medium and used by any of the method or system embodiments described herein, formatted for display to a user, used by another software module, method, or system, etc. Furthermore, the results may be stored "permanently," "semi-permanently," temporarily, or for some period of time.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A multi-beam scanning electron microscopy apparatus comprising:
   a multi-beam scanning electron microscopy sub-system comprising:
   a multi-beam electron beam source configured to generate a plurality of electron beams;
   a sample stage configured to secure a sample;
   an electron-optical assembly including a set of electron-optical elements configured to direct at least a portion of the plurality of electron beams onto a portion of the sample; and
   a detector assembly configured to detect a plurality of electron signal beams emanating from the surface of the sample to form a plurality of images, each image associated with an electron beam of the plurality of electron beams, wherein a first image contains a first instance of a pattern element obtained from a first location of the sample and at least an additional image contains an additional instance of the pattern element at an additional location of the sample; and
   a controller including one or more processors configured to execute a set of program instructions stored in memory for causing the one or more processors to:
   receive the plurality of images from the detector assembly;
   compare two or more of the images to identify one or more common positional noise components present in the two or more images; and
   remove the identified one or more common positional noise components from one or more images of the plurality of images by shifting the one or more images by an amount equal in distance and opposite in direction to the one or more common positional noise components.

2. The apparatus of claim 1, wherein the controller is configured to compare two or more of the images to identify common intensity variation present in the two or more images.

3. The apparatus of claim 1, wherein the set of electron-optical elements comprise:
   at least one of a condenser lens or objective lens.

4. The apparatus of claim 1, wherein the multi-beam electron beam source comprises:
   a field emission electron gun configured to generate an electron beam; and a multi-beam aperture plate configured to split the electron beam from the field emission electron gun into the plurality of electron beams.

5. The apparatus of claim 1, wherein the multi-beam electron beam source comprises:

two or more electron guns.

6. The apparatus of claim 1, wherein the detector assembly comprises:

a detector array.

7. The apparatus of claim 1, wherein the detector assembly comprises:

one or more secondary electron detectors.

8. The apparatus of claim 1, wherein the detector assembly comprises:

one or more backscattered electron detectors.

9. A method comprising:

simultaneously acquiring a plurality of images with a multi-beam scanning electron microscopy system, wherein a first image contains a first instance of a pattern element obtained from a first location of the sample and at least an additional image contains an additional instance of the pattern element at an additional location of the sample;

comparing two or more of the images to identify common positional noise components present in the two or more images; and removing the identified common positional noise components from one or more images of the plurality of images by shifting the one or more images by an amount equal in distance and opposite in direction to the common positional noise components.

* * * * *